United States Patent
Kang et al.

(10) Patent No.: US 7,421,636 B2
(45) Date of Patent: Sep. 2, 2008

(54) SEMICONDUCTOR MEMORY DEVICE HAVING A TEST CONTROL CIRCUIT

(75) Inventors: Hee Bok Kang, Daejeongwangyeok-si (KR); Jin Hong Ahn, Gyeonggi-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 302 days.

(21) Appl. No.: 11/296,433

(22) Filed: Dec. 8, 2005

(65) Prior Publication Data

US 2006/0271831 A1    Nov. 30, 2006

(30) Foreign Application Priority Data

May 30, 2005   (KR) ................. 10-2005-0045479

(51) Int. Cl.
   *G01R 31/28* (2006.01)
   *G11C 29/00* (2006.01)
(52) U.S. Cl. .................... 714/733; 714/718
(58) Field of Classification Search ............ 714/718, 714/710, 733
   See application file for complete search history.

(56) References Cited

U.S. PATENT DOCUMENTS

| | | | |
|---|---|---|---|
| 5,936,900 A | 8/1999 | Hii et al. | |
| 5,987,632 A | 11/1999 | Irrinki et al. | 714/711 |
| 6,067,262 A * | 5/2000 | Irrinki et al. | 365/201 |
| 6,226,764 B1 | 5/2001 | Lee | |
| 6,255,836 B1 | 7/2001 | Schwarz et al. | |
| 6,496,947 B1 * | 12/2002 | Schwarz | 714/30 |
| 6,505,313 B1 | 1/2003 | Phan et al. | |
| 6,560,740 B1 | 5/2003 | Zuraski, Jr. et al. | |
| 6,634,003 B1 * | 10/2003 | Phan | 714/710 |
| 6,691,264 B2 * | 2/2004 | Huang | 714/723 |
| 6,769,081 B1 * | 7/2004 | Parulkar | 714/733 |
| 6,829,728 B2 | 12/2004 | Cheng et al. | |
| 6,941,499 B1 | 9/2005 | Sung et al. | |
| 7,260,758 B1 * | 8/2007 | Agrawal et al. | 714/733 |

FOREIGN PATENT DOCUMENTS

| | | |
|---|---|---|
| JP | 2000-187999 | 7/2000 |
| JP | 2005-031018 | 2/2005 |
| KR | 1020010027673 A | 4/2001 |
| KR | 1020020068768 A | 8/2002 |

* cited by examiner

*Primary Examiner*—James C Kerveros
(74) *Attorney, Agent, or Firm*—Townsend and Townsend and Crew LLP

(57) ABSTRACT

A semiconductor memory device having a test control circuit includes a cell array, a BIST (built-in self test) circuit adapted and configured to perform a BIST operation on the cell array, a BISR (built-in self repair) circuit adapted and configured to perform a BISR operation on the cell array, and a command decoder adapted and configured to generate a first control signal for selecting a BIST operation by the BIST circuit or a test by an external tester and a second control signal for controlling a BISR operation by the BISR circuit. As a result, a test by an external tester, a BIST (built-in self test) and a BISR (built-in self repair) are individually performed in response to an additional command signal.

18 Claims, 10 Drawing Sheets

SEMICONDUCTOR MEMORY DEVICE HAVING A TEST CONTROL CIRCUIT

BACKGROUND OF THE INVENTION

1. Field of the Invention

The present invention generally relates to a semiconductor memory device, and more specifically concerns a memory device capable of being tested by an external tester or a Built-In Self Test (hereinafter, referred to as "BIST") and including a Built-In Self Repair (hereinafter, referred to as "BISR").

2. Description of the Related Art

In general, memory chip manufacturers perform a test on a memory at a manufacturing site.

Users depend on reliability of a chip to perform a proper operation of their system.

As a density and a linewidth of a memory cell in a memory chip are continuously reduced (currently, 0.5 micron or less), it is difficult to achieve a desired reliability.

As a result, the object of the memory device manufacturers is to increase memory capacity without reduction of chip yield due to a mis-operation product.

Before shipment of memory chips, the memory chips are tested to verify whether each memory cell of a memory array is properly performed.

In a conventional memory chip manufacturing site, memory chips have been tested by an external tester or automatic test equipment (ATE) However, it is difficult to detect a defective memory cell at a user site. Although the test equipment is usable by users, repair cost is expensive, it takes much time, and the equipment is impractical.

Thus, other memory chips comprises a BIST circuit and a BISR circuit.

When a power source is powered-up in the memory chip, the BIST is operated by a memory for reading and writing various patterns to determine a failed memory cell.

The BISR circuit repairs a row or a column which includes a failed cell with a spare row or a spare column in a memory array. As a result, normal chip performance can be obtained even when not all cells can be used because the BIST circuit and the BISR circuit are operated whenever a power source is applied to a system to detect a potential failure before the next system power source is applied.

However, since the conventional BIST and BISR performs an unconditional operation whenever a power source is applied to the system, a test by an external tester and a repair operation are performed at the same time. As a result, it is impossible to perform a precise test and an accurate repair operation.

SUMMARY OF THE INVENTION

Various embodiments of the present invention are directed at individually performing a BIST and a BISR in response to a separate command signal and also performing a test by an external tester and a repair operation.

According to one embodiment of the present invention, a semiconductor memory device having a test control circuit comprises a cell array, a BIST (built-in self test) circuit adapted and configured to perform a BIST operation on the cell array, a BISR (built-in self repair) circuit adapted and configured to perform a BISR operation on the cell array, and a command decoder adapted and configured to generate a first control signal for selecting a BIST operation by the BIST circuit or a test by an external tester and a second control signal for controlling a BISR operation by the BISR circuit.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 1:
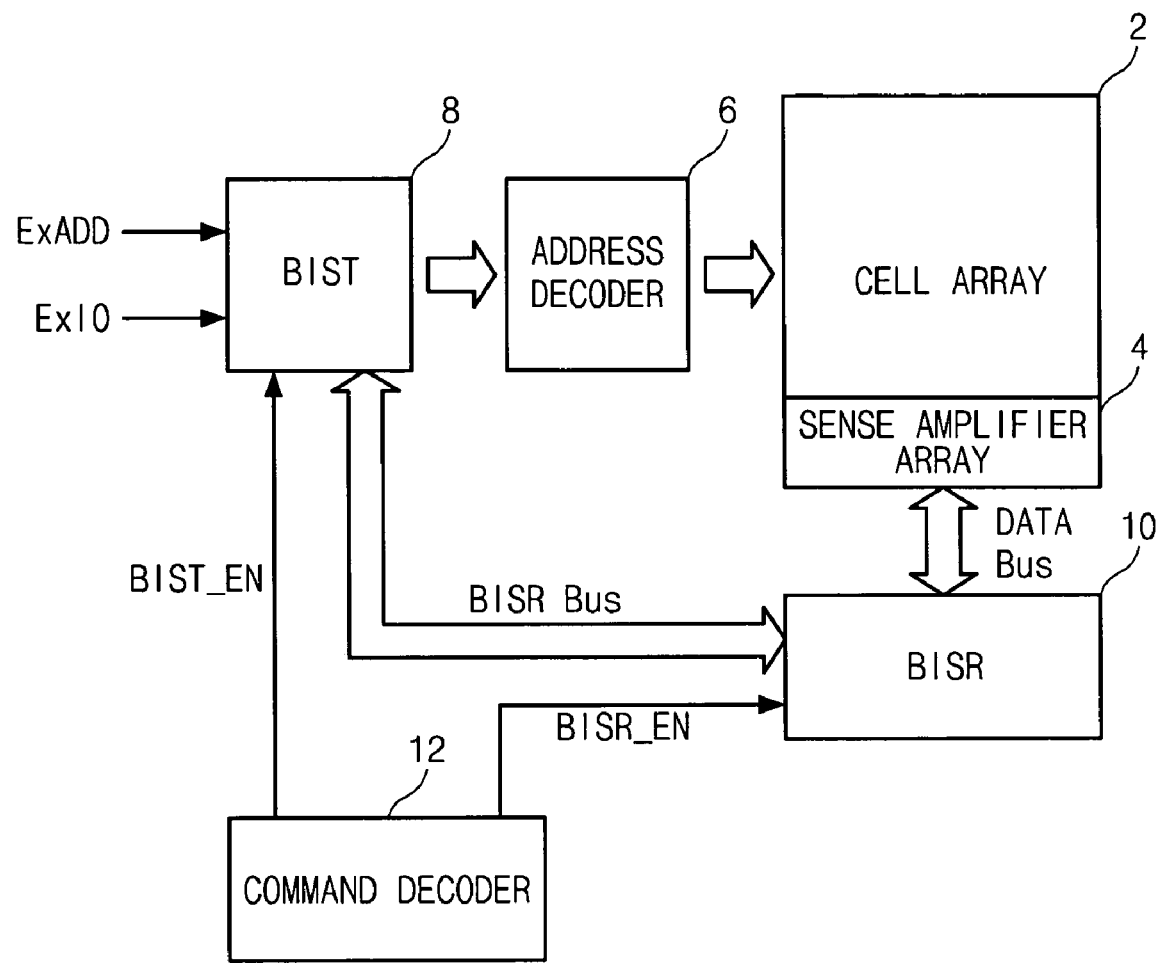
FIG. 1 is a block diagram illustrating a semiconductor memory device according to an embodiment of the present invention.

FIG. 1 is a block diagram illustrating a semiconductor memory device according to an embodiment of the present invention.

In this embodiment, a semiconductor memory device comprises a cell array 2, a sense amplifier array 4, an address decoder 6, a BIST 8, a BISR 10 and a command decoder 12.

The BIST 8 receives an external address ExADD and external data ExIO which may be provided by an external tester via a lead on the memory device.

The BIST 8 and the BISR 10 are connected by a BISR bus, and the BISR 10 and the sense amplifier 4 are connected by a data bus.

The command decoder 12 generates enable signals BIST_EN and BISR_EN to control the operations of the BIST 8 and the BISR 10. As a result, a BIST mode and a BISR mode can be individually controlled.

The address decoder 6 decodes an output signal from the BIST 8 to test the cell array 2.

Table 1 shows processing results in response to the enable signals BIST_EN and BISR_EN.

TABLE 1

| Command state | | Processing result | |
|---|---|---|---|
| BIST_EN | BISR_EN | Test | Repair |
| 0 | 0 | External tester | No repair |
| 0 | 1 | External tester | BISR |
| 1 | 0 | BIST | No repair |
| 1 | 1 | BIST | BISR |

As shown in Table 1, the command state includes 4 individual states.

When the enable signals BIST_EN and BISR_EN are all "0", a test can be performed by an external tester, and a fail bit repair is not performed.

When the enable signals BIST_EN and BISR_EN are "0" and "1" respectively, the test is possible by the external tester, and the fail bit repair is automatically performed by the BISR 10 without a repair algorithm of the external tester.

When the enable signals BIST_EN and BISR_EN are "1" and "0" respectively, a cell test is possible by the BIST 8, and the fail bit repair operation is not performed.

When the enable signals BIST_EN and BISR_EN are all "1", the cell test is possible by the BIST 8, and the fail bit repair operation is automatically performed by the BISR 10 without the repair algorithm of the external tester.

Figure 2:
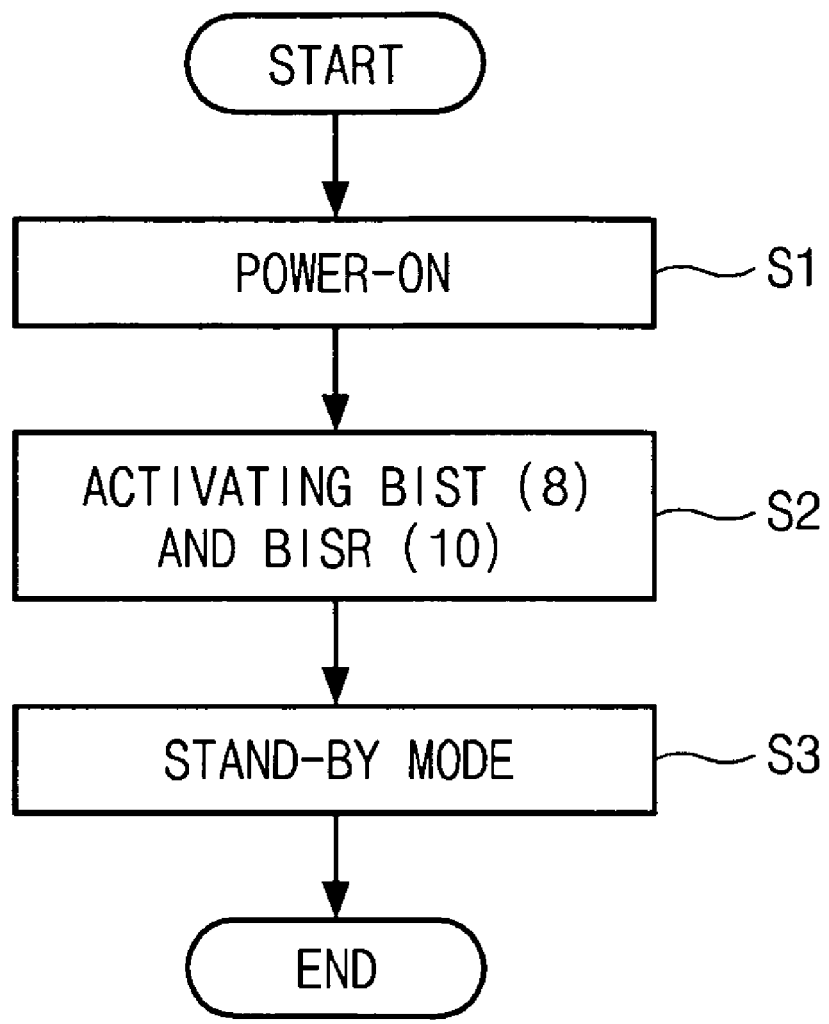
FIG. 2 is a flow chart illustrating the operation of the semiconductor memory device of FIG. 1.

FIG. 2 is a flow chart illustrating the operation of the semiconductor memory device of FIG. 1. FIG. 2 shows an operating method suitable for a volatile memory device such as a DRAM or a SRAM. When the device is a nonvolatile memory device such as a FRAM, it is not necessary to repeat the method continuously.

When a system power source reaches a predetermined level to be powered-on, a reset signal is generated (S1) to activated the BIST 8 and the BISR 10 (S2).

That is, the enable signals BIST_EN and BISR_EN become all "1", a cell test is possible by the BIST 8, and a fail bit repair operation is automatically performed by the BISR 10 without a repair algorithm of the external tester.

When the setting is completed, a stand-by mode starts (S3).

Figure 3:
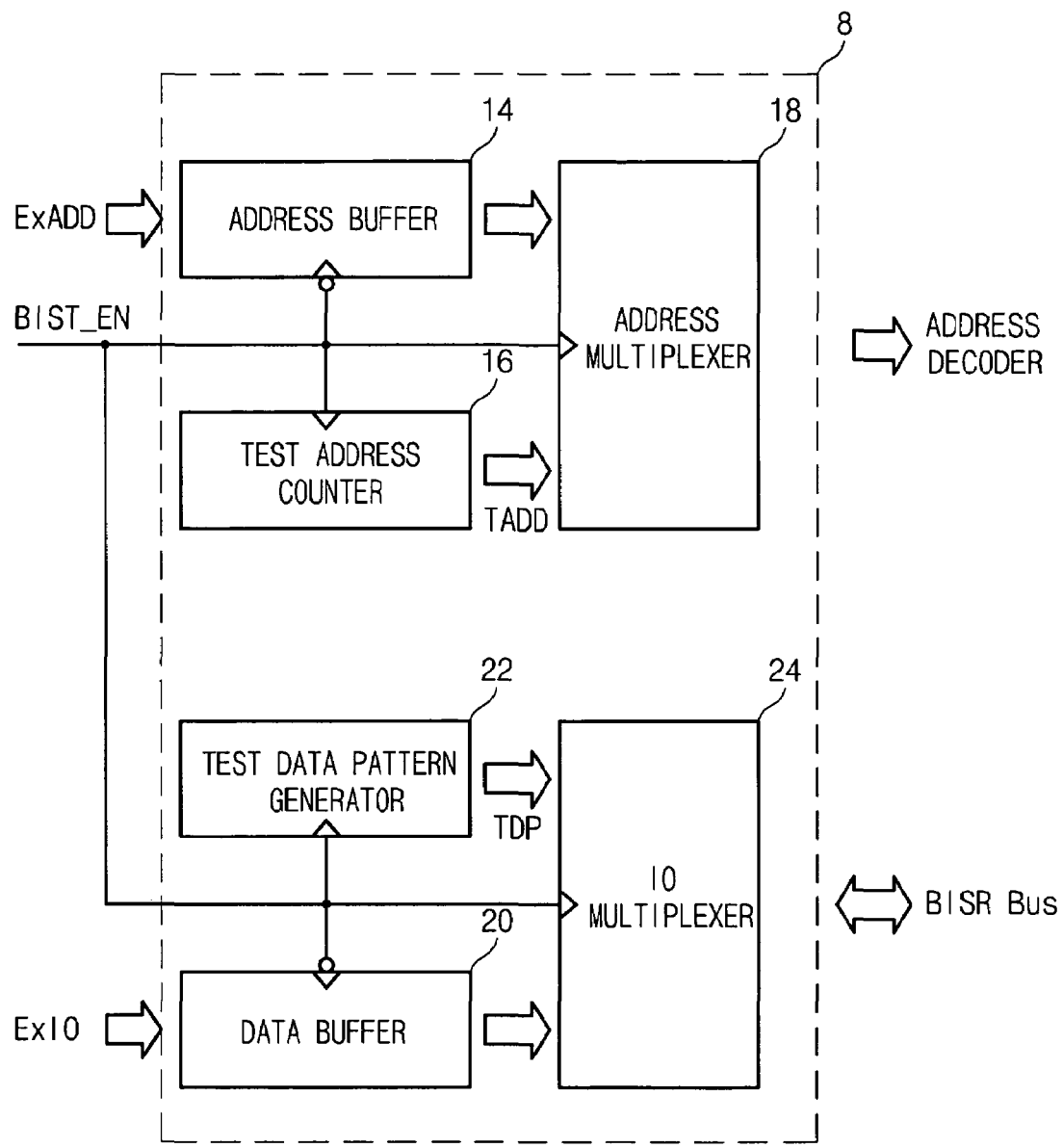
FIG. 3 is a block diagram illustrating a BIST of FIG. 1.

FIG. 3 is a block diagram illustrating the BIST 8 of FIG. 1.

The BIST 8 comprises an address buffer 14, a test address counter 16, an address multiplexer 18, a data buffer 20, a test data pattern generator 22, and an IO multiplexer 24.

The address buffer 14 receives the external address ExADD. Here, the address buffer 14 is inactivated when the enable signal BIST_EN is activated to a high level.

The test address counter 16 is activated to generate a test address TADD when the enable signal BIST_EN is activated to the high level.

The address multiplexer 18 outputs the test address TADD to the address decoder 6 when the enable signal BIST_EN is activated to the high level.

The data buffer 20 receives external IO data ExIO. Here, the data buffer 20 is inactivated when the enable signal BIST_EN is activated to the high level.

The test data pattern generator 22 generates a test data pattern TDP when the enable signal BIST_EN is activated to the high level.

The IO multiplexer 24 outputs the test data pattern TDP to the BISR bus when the enable signal BIST_EN is activated to the high level.

Figure 4:
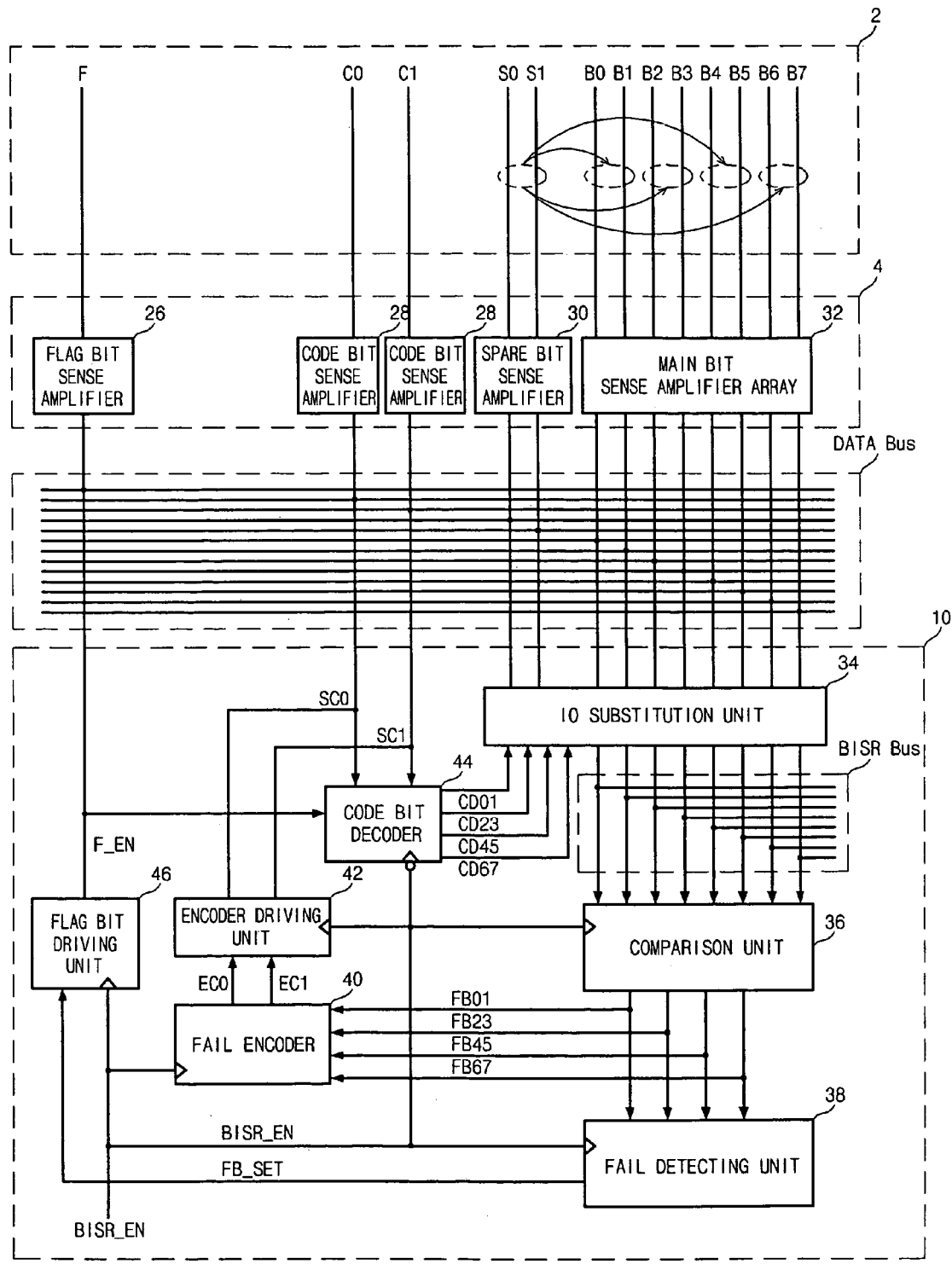
FIG. 4 is a block diagram illustrating a cell array, a sense amplifier array, and a BISR of FIG. 1.

FIG. 4 is a block diagram illustrating the cell array 2, the sense amplifier array 4, and the BISR 10 of FIG. 1.

FIG. 4 shows one of a plurality of sub cell arrays included in the cell array 2.

Although not illustrated herein, each sub cell array comprises a flag cell for storing a flag bit F which represents a repair state, a code cell for storing code bits C0 and C1, a spare cell and a main cell.

In the main cell, paired 2 bits are tested constantly, and a repair operation is performed on paired 2 bits. That is, the paired 2 bits constantly write the same data to test the data.

As a result, the spare cell constantly has a multiple of 2. Herein, the spare cell that is the 2 bit S0 or S1 is exemplified.

While 2 bits are paired off, four pairs B0, B1; B2, B3; B4, B5; B6, B7 are exemplified.

The sense amplifier array 4 comprises a flag bit sense amplifier 26, code bit sense amplifiers 28, spare bit sense amplifiers 30 and a main bit sense amplifier array 32.

The BISR 10 comprises an IO substitution circuit 34, a comparison circuit 36, a failure detecting circuit 38, a failure encoder 40, an encoder driving circuit 42, a code bit decoder 44 and a flag bit driving circuit 46.

The comparison circuit 36, the failure detecting circuit 38, the failure encoder 40, the encoder driving circuit 42 and the flag bit driving circuit 46 are activated when the enable signal BISR_EN is activated to the high level.

The code bit decoder 44 is activated only when the enable signal BISR_EN is inactivated to a low level. That is, the main cell is tested to determine whether the main cell is failed or not at a repair mode.

Figure 5:
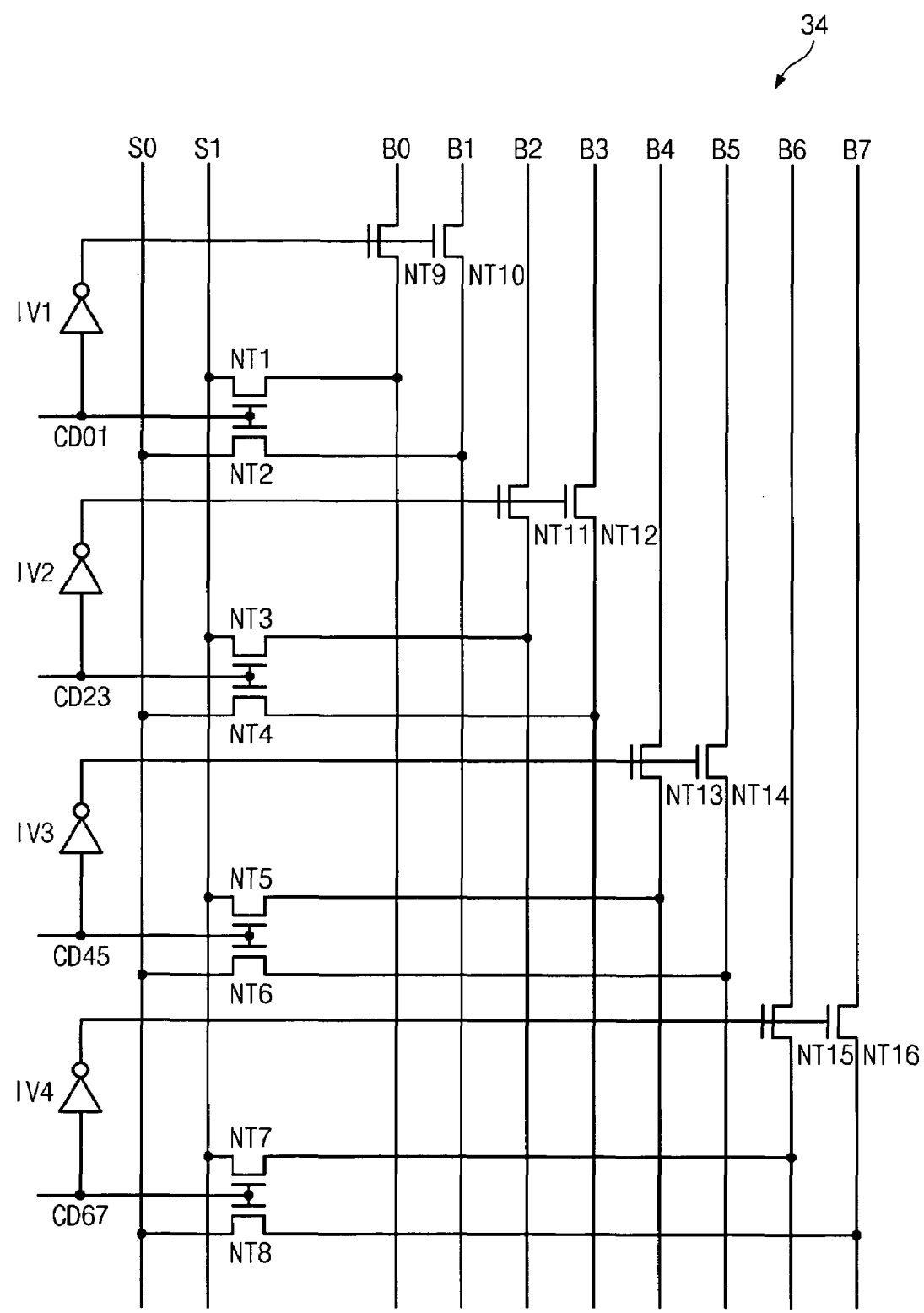
FIG. 5 is a circuit diagram illustrating an IO substitution circuit of FIG. 4.

FIG. 5 is a circuit diagram illustrating the IO substitution circuit of FIG. 4.

The IO substitution 34 comprises inverters IV1~IV4, and NMOS transistors NT1~NT16. Here, the NMOS transistors NT1~NT16 serve as a switch.

The inverters IV1~IV4 invert code decoding signals CD01~CD67, respectively.

The NMOS transistors NT1~NT8 connect the main data bit line pairs B0, B1~B6, B7 to the spare lines S0, S1 in response to the code decoding signals CD01~CD67.

The NMOS transistors NT9~NT16 disconnect the main data bit line pairs B0, B1~B6, B7 in response to output signals from the inverters IV1~IV4.

Since there are one pair of spare bits in this embodiment, only one of the code decoding signals CD01~CD67 are activated to a high level, and the rest signals are inactivated to a low level.

Figure 6:
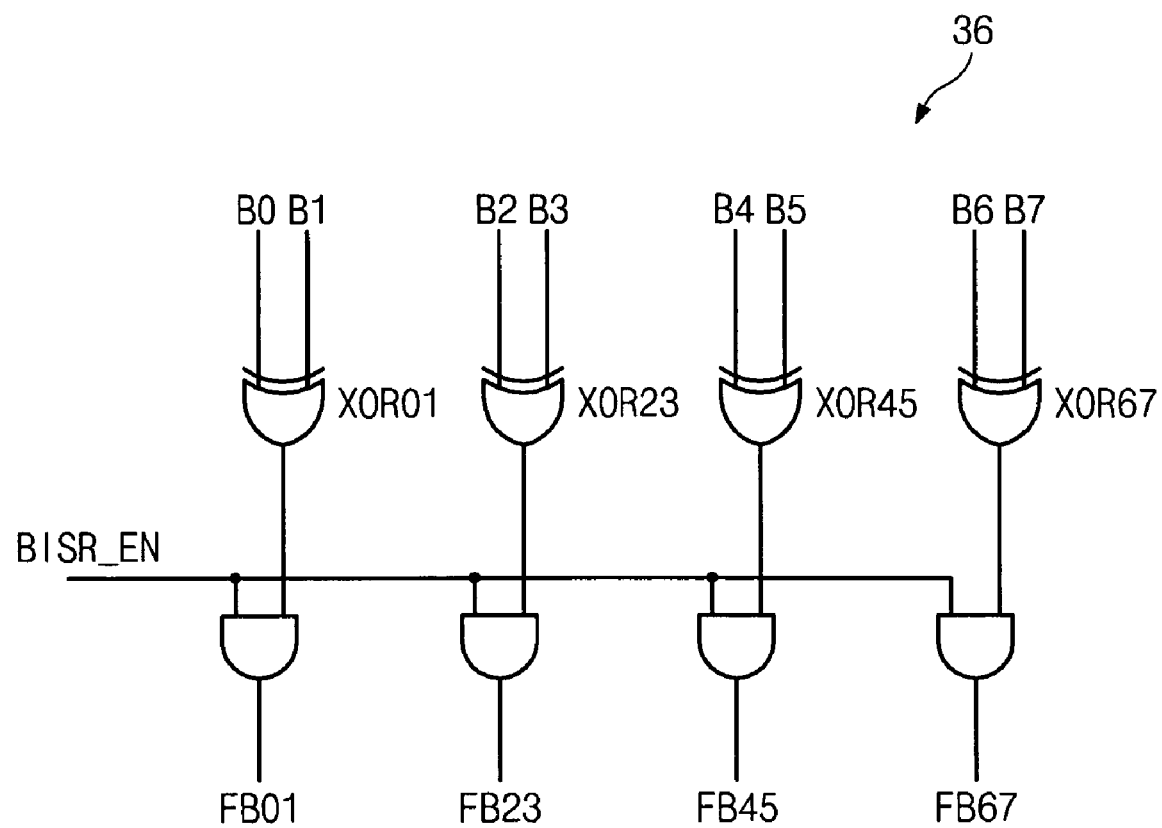
FIG. 6 is a circuit diagram illustrating a comparison circuit of FIG. 4.

FIG. 6 is a circuit diagram illustrating the comparison circuit 36 of FIG. 4.

The comparison circuit 36 comprises exclusive OR gates XOR01~XOR67, and AND gates AND1~AND4.

The exclusive OR gates XOR01~XOR67 detect whether data on the main data bit line pairs B0, B1~B6, B7 are the same or not when substitution is completed by the IO substitution circuit 34.

That is, after the same data are read, the output from the exclusive OR gates XOR01~XOR67 is "0" when the same data are detected, and "1" when the two data are not the same, that is, there is a failed bit.

The AND gates AND1~AND4 output output signals from the exclusive OR gates XOR01~XOR67 as fail bits FB01~FB67 when the enable signal BISR_EN is activated to the high level, and the fail bits FB01~FB67 at all low levels when the enable signal BISR_EN is inactivated to the low level.

Figure 7:
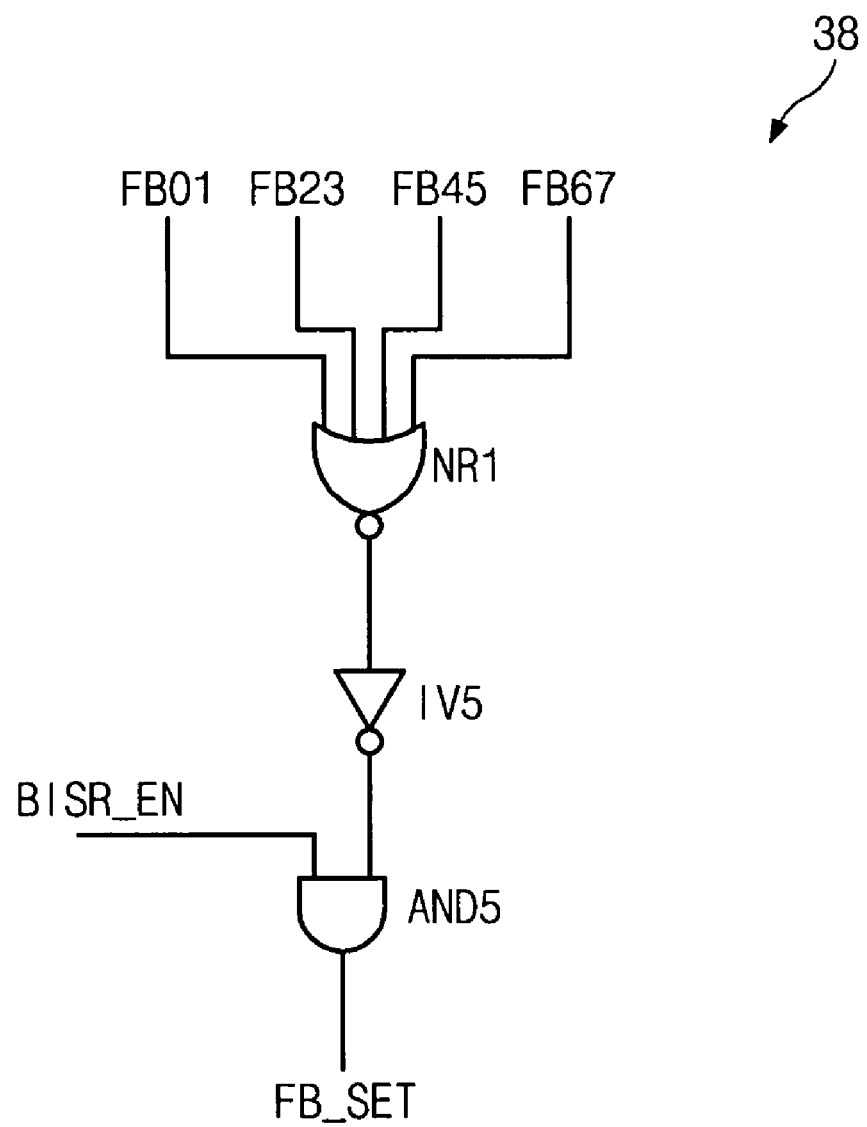
FIG. 7 is a circuit diagram illustrating a failure detecting circuit of FIG. 4.

FIG. 7 is a circuit diagram illustrating the failure detecting circuit of FIG. 4.

The failure detecting circuit 38 comprises a NOR gate NR1, an inverter IV5 and an AND gate AND5.

The NOR gate NR1 performs a NOR operation on the fail bits FB01~FB67, and the inverter IV5 inverts an output signal from the NOR gate NR1.

The AND gate AND5 outputs an output signal from the inverter IV5 as a failed bit setting signal FB_SET when the enable signal BISR_EN is activated to the high level, and the failed bit setting signal FB_SET at the low level when the enable signal BISR_EN is inactivated to the low level.

The flag bit driving circuit 46 sets a state of a flag enable signal F_EN by a failed bit setting signal RB_SET.

The operation of the failure encoder 40 of FIG. 4 is described with reference to Table 2.

TABLE 2

| Input | | | | | Output | |
|---|---|---|---|---|---|---|
| BISR_EN | FB01 | FB23 | FB45 | FB67 | EC0 | EC1 |
| 1 | 1 | 0 | 0 | 0 | 0 | 0 |
| 1 | 0 | 1 | 0 | 0 | 0 | 1 |

TABLE 2-continued

| Input | | | | | Output | |
|---|---|---|---|---|---|---|
| BISR_EN | FB01 | FB23 | FB45 | FB67 | EC0 | EC1 |
| 1 | 0 | 0 | 1 | 0 | 1 | 0 |
| 1 | 0 | 0 | 0 | 1 | 1 | 1 |

In the failure encoder 40, while the enable signal BISR_EN is activated to the high level, encoding codes EC0 and EC1 become "0" when the fail bit FB01 is "1", and the encoding codes EC0, EC1 are "0" and "1" respectively when the fail bit FB23 is "1", the encoding codes EC0, EC1 are "1" and "0" respectively when the fail bit FB45 is "1", and the encoding codes EC0, EC1 are all "1" when the fail bit FB67 is "1".

Since the failure encoder 40 is a common encoder circuit having input of 4 bits and output of 2 bits, the detailed structure of the circuit is not explained.

The operation of the failure encoder 44 of FIG. 4 is described with reference to Table 3.

TABLE 3

| Input | | | | Output | | | |
|---|---|---|---|---|---|---|---|
| BISR_EN | F_EN | SC0 | SC1 | CD01 | CD23 | CD45 | CD67 |
| 0 | 1 | 0 | 0 | 1 | 0 | 0 | 0 |
| 0 | 1 | 1 | 0 | 0 | 1 | 0 | 0 |
| 0 | 1 | 0 | 1 | 0 | 0 | 1 | 0 |
| 0 | 1 | 1 | 1 | 0 | 0 | 0 | 1 |
| 0 | 0 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |
| 0 | 0 | 1 | 1 | 0 | 0 | 0 | 0 |

The code bit decoder 44 is activated when the enable signal BISR_EN is inactivated to the low level and the flag enable signal F_EN is activated to a high level.

The encoding codes EC0, EC1 are driven by the encoder driving circuit 42 to obtain driving codes SC0, SC1. While the code bit decoder 44 is inactivated, the code decoding signal CD23 is activated to "1" when the driving codes SC0, SC1 are "0" and "1" respectively, the code decoding signal CD45 is activated to "1" when the driving codes SC0, SC1 are "1" and "0" respectively, and the code decoding signal CD67 is activated to "1" when the driving codes SC0, SC1 are all "1".

The code bit decoder 44 sets the code decoding signals CD01~CD67 all to be "0" when the enable signal BISR_EN is activated to the high level or the flag enable signal REN is inactivated to a low level.

Since the code bit decoder 44 is a common encoder circuit having input of 4 bits and output of 2 bits, the detailed structure of the circuit is not explained.

Figure 8:
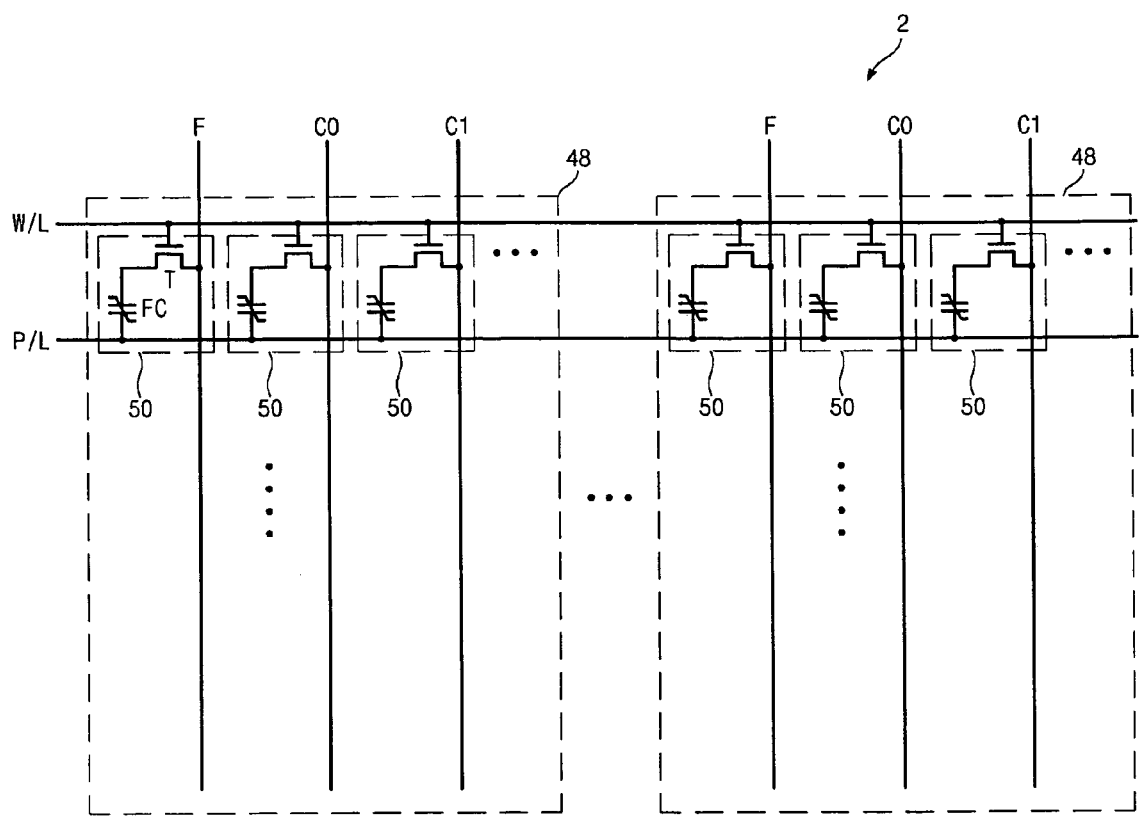
FIGS. 8 to 10 are circuit diagrams illustrating a cell array of FIGS. 1 and 4.

FIG. 8 is a circuit diagram illustrating one example of the cell array 2 of FIGS. 1 and 4. Here, a nonvolatile FRAM cell is exemplified.

Each of the plurality of sub cell arrays 48 comprised in the cell array 2 is selected by a word line W/L and a plate line P/L, and includes a plurality of memory cells 50.

Each of the memory cells 50 comprises one cell transistor T and one ferroelectric capacitor FC.

Figure 9:
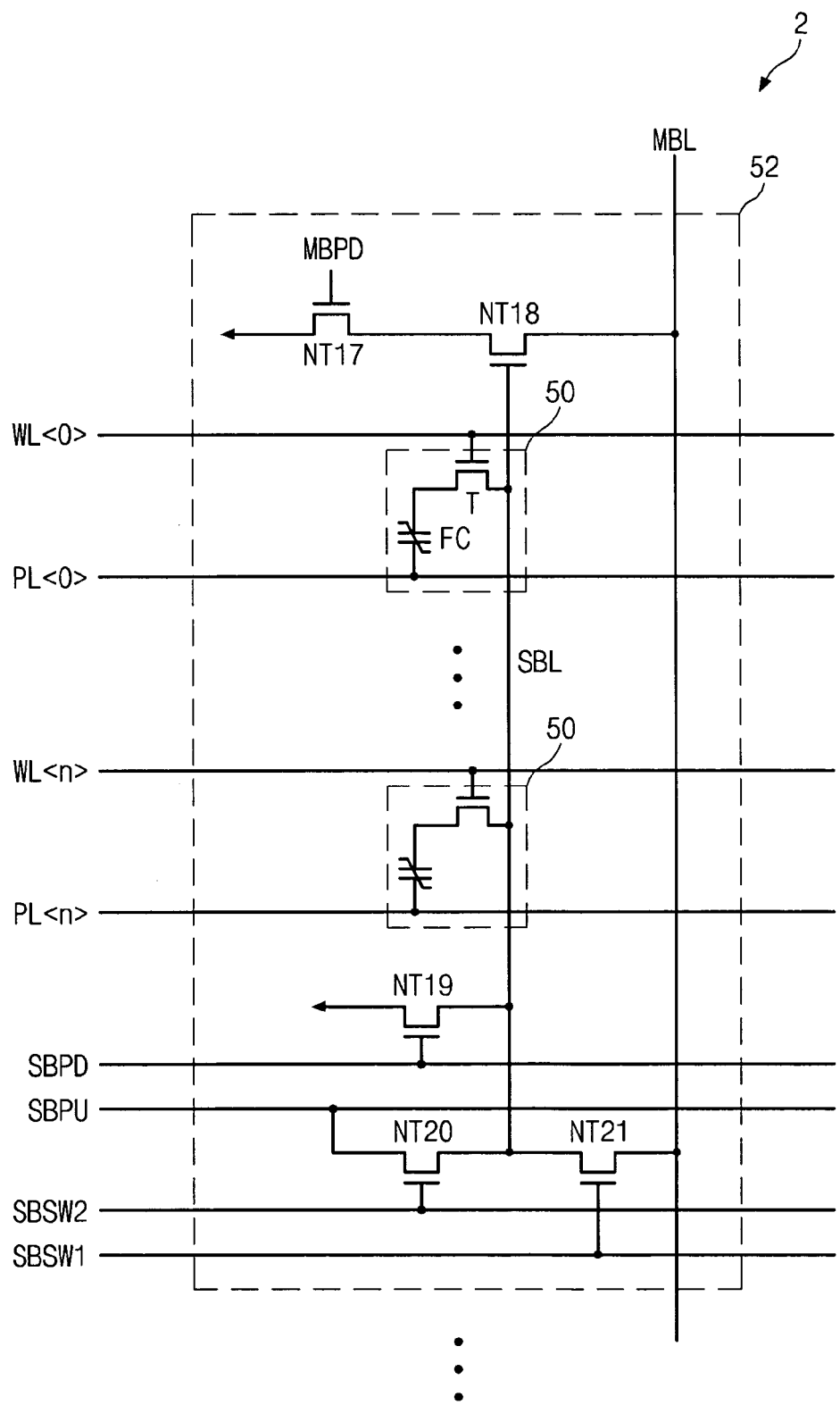

FIG. 9 is a circuit diagram illustrating another example of the cell array 2 of FIGS. 1 and 4. Here, a nonvolatile FRAM cell is exemplified.

Each of a plurality of sub cell arrays 52 comprised in the cell array 2 comprises a main bit line MBL, a sub bit line SBL, a plurality of memory cells 50 and a plurality of switches NT17~NT21. The plurality of memory cells 50 are selected and controlled by word lines WL<0>~WL<n> and plate lines PL<0>~PL<n>. The plurality of switches NT17~NT21 are controlled by a main bit line pull-down signal MBPD, a sub bit line SBL, a sub bit line pull-down signal SBPD, and a sub bit line switch signals SBSW1, SBSW2. Here, SBPU is a sub bit line pull-up voltage.

The memory cell 50 comprises one cell transistor T and one ferroelectric capacitor FC.

Figure 10:
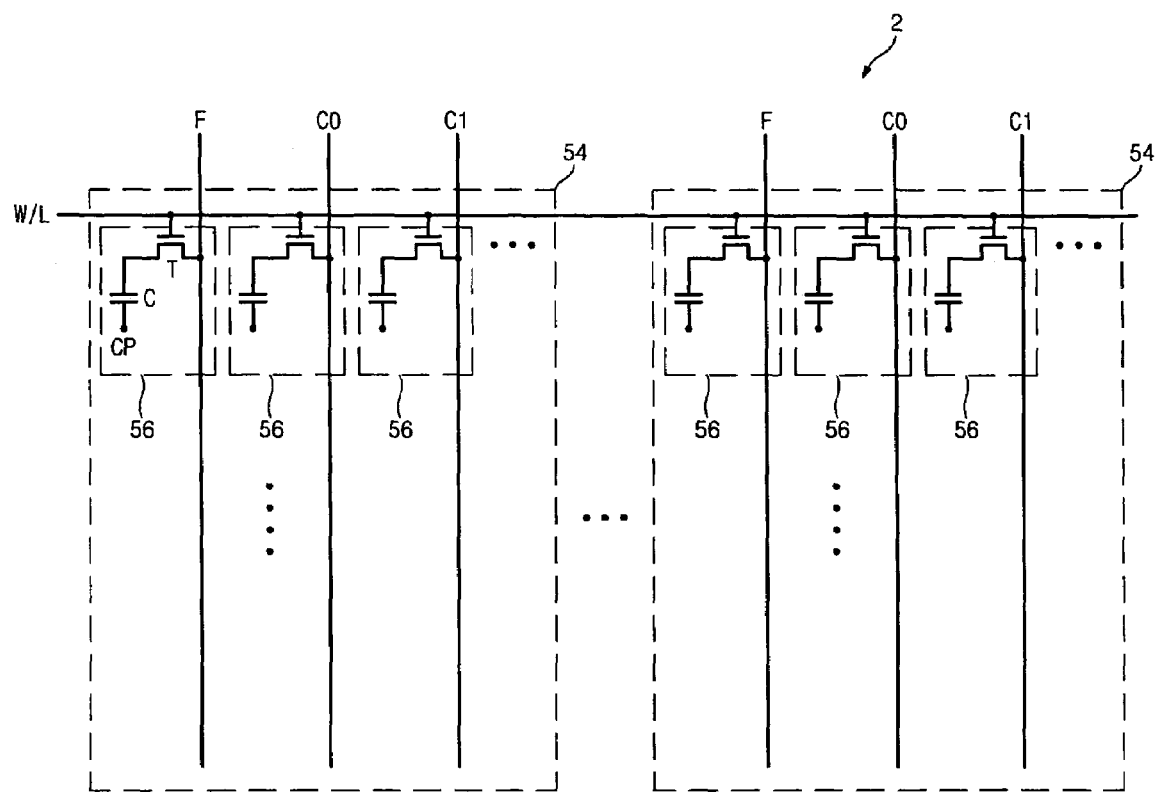

FIG. 10 is a circuit diagram illustrating still another example of the cell array 2 of FIGS. 1 and 4. Here, a DRAM cell is exemplified.

Each of the plurality of sub cell arrays 54 comprised in the cell array 2 is selected by a word line W/L, and includes a plurality of memory cells 56.

Here, the memory cell 56 comprises one cell transistor T and one capacitor C.

As described above, in a semiconductor memory device having a test control circuit according to an embodiment of the present invention, a BIST by an additional command signal, a test by an external tester, a BISR and a repair operation by an external tester can be performed individually.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A semiconductor memory device having a test control circuit, the device comprising:
   a cell array including a code cell for storing code decoding bits;
   a BIST (built-in self test) circuit configured to perform a BIST operation on the cell array in response to a first control signal;
   a BISR (built-in self repair) circuit configured to encode a fail bit of the main cell for generating a driving code, to decode the driving code in response to a second control signal for outputting a code decoding signal, and to perform a BISR operation on the cell array in response to the code decoding signal; and
   a command decoder configured to generate the first control signal for selecting the BIST operation or a test by an external tester, and the second control signal for controlling the BISR operation.

2. The semiconductor memory device according to claim 1, wherein the cell array comprises a plurality of sub cell arrays.

3. The semiconductor memory device according to claim 2, wherein the sub cell array comprises a plurality of memory cells.

4. The semiconductor memory device according to claim 3, wherein each one of the plurality of memory cells is a DRAM cell.

5. The semiconductor memory device according to claim 3, wherein each one of the plurality of memory cells is a FRAM cell.

6. The semiconductor memory device according to claim 5, wherein the plurality of memory cells has a hierarchical bit line structure.

7. The semiconductor memory device according to claim 1, wherein the BIST circuit comprises:

an address buffer configured to receive an external address;

a test address counter configured to generate a test address in response to the first control signal;

an address multiplexer configured to selectively output the test address or an output signal from the address buffer in response to the first control signal;

a data buffer configured to receive external data;

a test data pattern generator configured to generate a test data pattern in response to the first control signal; and a data multiplexer configured to selectively output the test data pattern or an output signal from the data buffer in response to the first control signal.

8. The semiconductor memory device according to claim 1, wherein the BISR circuit comprises:

a bit line substitution circuit configured to substitute a bit line connected to a failed cell with a spare bit line in response to a code signal which represents a failed cell;

a comparison circuit configured to detect whether data on the bit line are failed or not;

a failure detecting circuit configured to generate a flag signal which represents fail in response to a result of the comparison circuit; and a failure encoder configured to generate the code signal in response to the result of the comparison circuit.

9. The semiconductor memory device according to claim 8, wherein the bit line substitution circuit comprises:

a plurality of first switch circuits each configured to selectively connected the bit line to the spare bit line in response to the code signal; and a plurality of second switch circuits each configured to separate a bit line of the BISR circuit region from a bit line of the cell array region in response to the code signal.

10. The semiconductor memory device according to claim 8, wherein the comparison circuit comprises a plurality of detecting circuits each configured to detect whether data on the bit line are the same as data on another bit line or not.

11. The semiconductor memory device according to claim 10, further comprising a plurality of transmission circuits each configured to selectively transmit output signals from the plurality of detecting circuits in response to the second control signal.

12. The semiconductor memory device according to claim 8, wherein the failure detecting circuit comprises a failure detecting circuit configured to generate the flag signal when a failure is detected in a result of the comparison circuit.

13. The semiconductor memory device according to claim 12, wherein the failure detecting circuit further comprises a transmission circuit configured to selectively transmit the flag signal in response to the second control signal.

14. The semiconductor memory device according to claim 8, further comprising:

a failure encoding circuit configured to encode results of the comparison circuit; and a code bit decoder configured to decode output signals from the failure encoding circuits to generate the code signal.

15. The semiconductor memory device according to claim 14, further comprising an encoding driving circuit configured to drive an output signal from the failure encoding circuit.

16. The semiconductor memory device according to claim 14, wherein the code bit decoder is controlled in response to the flag signal.

17. The semiconductor memory device according to claim 1, wherein the cell array comprises:

a plurality of flag cells each configured to store a flag bit which represents a repair;

a plurality of code cells each configured to store the code decoding bits;

a plurality of spare cells each configured to substitute for failed cells; and a plurality of main cells configured to store normal data.

18. The semiconductor memory device according to claim 17, wherein the cell array further comprises a plurality of sense amplifiers each configured to read or write data in the flag cell, the code cell, the spare cell and the main cell.

* * * * *